United States Patent
Cosgrave et al.

(10) Patent No.: US 9,088,256 B2
(45) Date of Patent: Jul. 21, 2015

(54) APPARATUS AND METHODS FOR AMPLIFIER FAULT PROTECTION

(75) Inventors: Gavin P. Cosgrave, Enniscorthy (IE); Javier Alejandro Salcedo, North Billerica, MA (US); Yuhong Huang, Mountain View, CA (US); David J. Clarke, Patrickswell (IE); Minsheng Li, Mountain View, CA (US)

(73) Assignee: Analog Devices, Inc., Norwood, MA (US)

( * ) Notice: Subject to any disclaimer, the term of this patent is extended or adjusted under 35 U.S.C. 154(b) by 423 days.

(21) Appl. No.: 13/570,101

(22) Filed: Aug. 8, 2012

(65) Prior Publication Data

US 2014/0043715 A1  Feb. 13, 2014

(51) Int. Cl.
| | |
|---|---|
| H02H 3/20 | (2006.01) |
| H03F 1/52 | (2006.01) |
| H03G 11/08 | (2006.01) |
| H03G 1/00 | (2006.01) |
| G01R 17/02 | (2006.01) |
| G01R 1/30 | (2006.01) |
| G01R 19/00 | (2006.01) |
| H02H 3/24 | (2006.01) |

(52) U.S. Cl.
CPC ............... *H03F 1/52* (2013.01); *H03G 1/0088* (2013.01); *H03G 11/08* (2013.01); *G01R 1/30* (2013.01); *G01R 17/02* (2013.01); *G01R 19/0084* (2013.01); *H02H 3/20* (2013.01); *H02H 3/24* (2013.01)

(58) Field of Classification Search
USPC .......................................................... 361/90
See application file for complete search history.

(56) References Cited

U.S. PATENT DOCUMENTS

| | | | | |
|---|---|---|---|---|
| 3,521,087 A | | 7/1970 | Lombardi | |
| 5,455,732 A | * | 10/1995 | Davis | 361/90 |
| 5,831,061 A | * | 11/1998 | Adams et al. | 536/23.51 |
| 5,838,146 A | * | 11/1998 | Singer | 323/270 |

(Continued)

FOREIGN PATENT DOCUMENTS

JP   2005-045539   2/2005

OTHER PUBLICATIONS

International Search Report and Written Opinion of the International Searching Authority, PCT Appl. No. PCT/US2013/052711, dated Nov. 20, 2013, 9 pages.

(Continued)

*Primary Examiner* — Ronald W Leja
(74) *Attorney, Agent, or Firm* — Knobbe Martens Olson & Bear LLP

(57) ABSTRACT

An amplifier includes a fault protection control circuit biased from the signal pin and a fault protection circuit including a first PMOS transistor and a second PMOS transistor. The sources and bodies of the first and second PMOS transistors can be connected to one another, the drain of the first PMOS transistor can be connected to the amplifier's output, and the drain of the second PMOS transistor can be connected to a signal pin. During normal operating conditions, the fault protection control circuit can turn on the first and second PMOS transistors. However, the fault protection control circuit can turn off the first PMOS transistor and turn on the second PMOS transistor when an overvoltage condition is detected, and can turn on the first PMOS transistor and turn off the second PMOS transistor when an undervoltage condition is detected, even when the integrated circuit is unpowered.

25 Claims, 10 Drawing Sheets

(56) References Cited

U.S. PATENT DOCUMENTS

| | | | |
|---|---|---|---|
| 7,262,946 | B2 | 8/2007 | Harries et al. |
| 7,324,315 | B2 | 1/2008 | Harris |
| 7,342,433 | B2 | 3/2008 | Harris et al. |
| 7,375,942 | B1 | 5/2008 | Harris |
| 7,492,566 | B2 | 2/2009 | Harris |
| 7,576,962 | B2 | 8/2009 | Harris |
| 7,646,576 | B2 | 1/2010 | Harris et al. |
| 8,570,697 | B2 * | 10/2013 | Stevens et al. ............... 361/91.1 |
| 2002/0079851 | A1 * | 6/2002 | Uno .............................. 318/254 |
| 2005/0093622 | A1 | 5/2005 | Lee |
| 2006/0098363 | A1 | 5/2006 | Hebert et al. |
| 2006/0098373 | A1 | 5/2006 | Hebert et al. |
| 2007/0063774 | A1 | 3/2007 | Dupuis et al. |
| 2009/0109587 | A1 * | 4/2009 | Smith et al. .................... 361/86 |
| 2009/0116158 | A1 * | 5/2009 | Graves et al. .................. 361/86 |
| 2010/0123983 | A1 | 5/2010 | Elms |
| 2010/0164619 | A1 | 7/2010 | Kim et al. |
| 2010/0194352 | A1 * | 8/2010 | Kitano et al. ................. 320/162 |
| 2011/0051303 | A1 * | 3/2011 | Migliavacca ................ 361/91.5 |
| 2013/0063851 | A1 * | 3/2013 | Stevens et al. ............... 361/91.1 |
| 2014/0085761 | A1 * | 3/2014 | Croft .......................... 361/91.5 |

OTHER PUBLICATIONS

International Preliminary Report on Patentability, PCT Appl. No. PCT/US2013/052711, dated Feb. 10, 2015, 5 pages.

* cited by examiner

US 9,088,256 B2

APPARATUS AND METHODS FOR AMPLIFIER FAULT PROTECTION

BACKGROUND

1. Field

Embodiments of the invention relate to electronic systems, and more particularly, to fault protection systems for amplifiers.

2. Description of the Related Technology

Certain amplifiers can be exposed to a fault condition, in which the voltage level of a pin of the amplifier falls outside a range of voltage associated with normal operating conditions. For example, amplifiers can communicate using a ratiometric signaling protocol, in which the amplifier generates an output signal proportional to a measured parameter, such as pressure, temperature, air flow, mass flow, speed, acceleration, fluid level, or the like. The ratiometric signaling protocol can have valid signal ranges defined by a power high supply voltage and a power low supply voltage. For example, a signal may be defined as having a valid signal range within about 10% to about 90% of a voltage difference between the power high and power low supply voltages, with signals falling outside of the valid signal range indicating fault conditions.

A fault condition can arise on a signaling interface for a variety of reasons. For example, fault conditions can be associated with floating power high and/or floating power low supply voltages. Additionally, fault conditions can arise after interface misconnection, such as misconnection of a load resistor or misconnection of the amplifier's power high and power low supply voltage pins, which can lead to overvoltage or undervoltage conditions on the signaling interface. Furthermore, a fault condition can arise from a transient electrical event, or an electrical signal of relatively short duration having rapidly changing voltage and high power. Transient electrical events can include, for example, electromagnetic interference (EMI) and electrostatic discharge (ESD) events, such as those defined by standards sets by various organizations, such as the Joint Electronic Device Engineering Council (JEDEC), the International Electrotechnical Commission (IEC), the Automotive Engineering Council (AEC), and the International Organization for Standardization (ISO).

SUMMARY

In one embodiment, an apparatus includes an amplifier including an output configured to generate an output signal, a signal pin configured to receive the output signal from the output of the amplifier, a fault protection circuit, and a fault protection control circuit. The fault protection circuit is electrically connected between the output of the amplifier and the signal pin, and the fault protection circuit includes a first transistor and a second transistor. The first transistor includes a drain electrically connected to the output of the amplifier, a source, and a gate. The second transistor includes a drain electrically connected to the signal pin, a source electrically connected to the source of the first transistor, and a gate. The fault protection control circuit is configured to control the fault protection circuit at least in part by controlling voltage levels of the gates of the first and second transistors. The fault protection control circuit includes an overvoltage detection and control circuit configured to detect an overvoltage condition of the signal pin and to turn off the first transistor when the overvoltage condition is detected and otherwise turn on the first transistor. The fault protection circuit further includes an undervoltage detection and control circuit configured to detect an undervoltage condition of the signal pin and to turn off the second transistor when the undervoltage condition is detected and otherwise turn on the second transistor. The fault protection control circuit is powered at least in part by the signal pin, and a bias of the fault protection control circuit is provided by current at a node of the sources of the first and second transistors.

In another embodiment, an apparatus includes an amplifier including an output configured to generate an output signal, a signal pin configured to receive the output signal from the output of the amplifier, a fault protection circuit, and a fault protection control circuit. The fault protection circuit is electrically connected between the output of the amplifier and the signal pin. The fault protection circuit includes a first transistor and a second transistor. The first transistor includes a drain electrically connected to the output of the amplifier, a source, and a gate. The second transistor includes a drain electrically connected to the signal pin, a source electrically connected to the source of the first transistor, and a gate. The fault protection control circuit is configured to control the fault protection circuit at least in part by controlling voltage levels of the gates of the first and second transistors. The fault protection control circuit is further configured to detect an overvoltage condition of the signal pin and to turn off one of the first transistor or the second transistor when the overvoltage condition is detected. The fault protection control circuit is further configured to detect an undervoltage condition of the signal pin and to turn off the other of the first transistor or the second transistor when the undervoltage condition is detected.

DETAILED DESCRIPTION OF EMBODIMENTS

Figure 1:
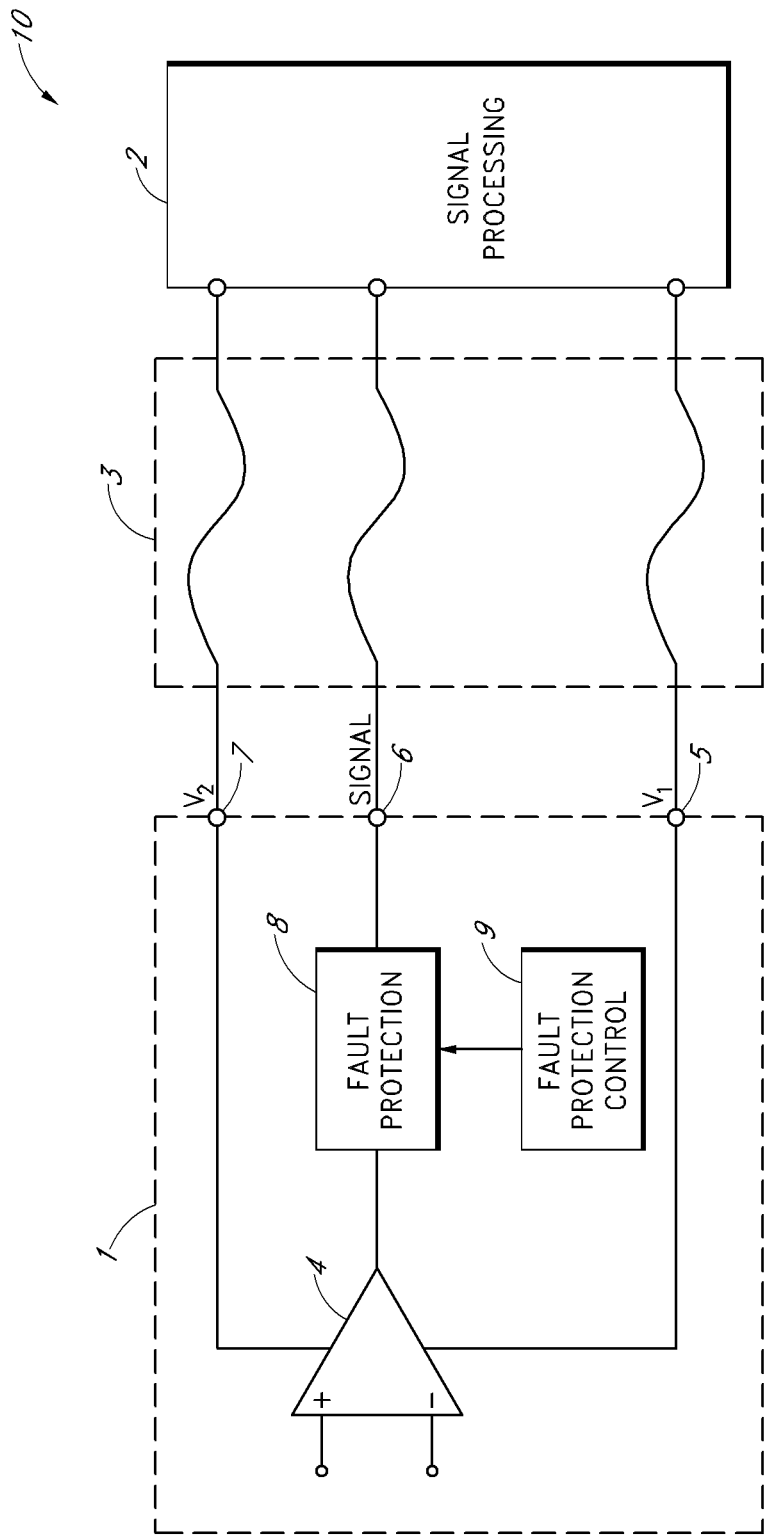
FIG. 1 is a schematic block diagram of one embodiment of an electronic amplification system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

In certain implementations, an amplifier is provided with a fault protection circuit for protecting the amplifier from overvoltage or undervoltage conditions. The fault protection circuit can include a first metal oxide semiconductor (MOS) transistor and a second MOS transistor electrically connected in series between the amplifier's output and a signal pin. For example, the sources of the first and second MOS transistors can be connected to one another, and the drain of the first MOS transistor can be connected to the amplifier's output and the drain of the second MOS transistor can be connected to the signal pin. A fault protection control circuit can be provided for detecting overvoltage and undervoltage conditions of the signal pin and for controlling a state of the fault protection circuit based on the detected conditions. For example, during normal operating conditions the fault protection control circuit can turn on the first and second MOS transistors to permit the amplifier to control the voltage level of the signal pin. However, the fault protection control circuit can turn off the first MOS transistor and turn on the second MOS transistor when an overvoltage condition is detected, and can turn on the first MOS transistor and turn off the second MOS transistor when an undervoltage condition is detected.

In certain implementations, the first and second MOS transistors are enhancement-mode p-type transistors, such as p-type laterally diffused metal oxide semiconductor (PLDMOS) transistors. Using p-type MOS transistors can help prevent parasitic diode structures associated with the first and second transistors from becoming forward-biased during overvoltage and undervoltage conditions on the signal pin. In certain implementations, a charge pump can be included to help drive the gates of the first and second p-type MOS transistors to voltage levels below a power low or ground supply. Including a charge pump can allow the output of the amplifier to have a large output swing, such as a rail-to-rail output swing. However, the amplifier can be configured to have a large output swing in other ways, such as configurations in which the first and second MOS transistors are n-type MOS transistors or depletion-mode MOS transistors. In certain configurations, the fault protection control circuit is powered at least in part by the signal pin, thereby allowing fault protection to be provided even when the amplifier's power supply pins are misconnected, floating, or a combination thereof.

Overview of an Example of an Electronic System including an IC with Fault Protection FIG. 1 is a schematic block diagram of one embodiment of an electronic amplification system 10. The electronic amplification system 10 includes an integrated circuit (IC) 1, a signal processing block 2, and an interface 3. The IC 1 includes an amplifier or driver 4, a power low supply voltage pin or $V_1$ pin 5, a signal pin 6, a power high supply voltage pin or $V_2$ pin 7, a fault protection circuit 8, and a fault protection control circuit 9.

The IC 1 can be used to communicate with the signal processing block 2 using the interface 3. For example, the amplifier 4 can be used to transmit a signal from the IC 1 to the signal processing block 2 over the interface 3 by controlling a voltage level of the signal pin 6. In the illustrated configuration, the interface 3 has also been used to electrically power the amplifier 4 by providing power high and power low supply voltages to the IC 1 over the interface 3. However, other implementations are possible, including, for example, configurations including a different arrangement of pins and/or more or fewer pins.

In certain implementations, the interface 3 is a ratiometric signaling interface, and the amplifier 4 is configured to control the voltage level of the signal pin 6 within a valid signal range defined by the voltage levels of the power high and power low supply voltage pins $V_2$, $V_1$. When using a ratiometric signaling interface, signals falling outside of the valid signal range can indicate fault conditions.

The IC 1 includes the fault protection circuit 8, which can be used to protect the amplifier 4 during a fault condition on the signal pin 6. For example, the fault protection control circuit 9 can operate the fault protection circuit 8 in a high-impedance state when the signal pin 6 is in an overvoltage condition or an undervoltage condition. However, the fault protection control circuit 9 can operate the fault protection circuit 8 in a low-impedance state during normal operating conditions so as to permit the amplifier 4 to control the voltage level of the signal pin 6 during normal operation.

In one embodiment, the IC 1 can be an automobile sensor IC configured to detect pressure and/or temperature, the signal processing block 2 can be an engine control unit (ECU) of the automobile, and the interface 3 can be an electrical harness associated with cables used to connect the sensor IC to the ECU. Although one configuration of an electronic system has been described, the teachings herein are applicable to a wide variety of electronic systems, including, for example, local interconnect network (LIN) and controller area network (CAN) protocol systems, transmission line systems, industrial control systems, power management systems, microelectromechanical system (MEMS) sensor systems, and/or transducer systems.

Although the fault protection circuit 8 and the fault protection control circuit 9 are illustrated in the context of the electronic amplification system 10, the fault protection circuit 8 and the fault protection control circuit 9 can be used in a wide array of ICs and other electronics that include an amplifier having an output exposed to overvoltage and undervoltage conditions.

Overview of Certain Fault Protection Embodiments

Figure 2:
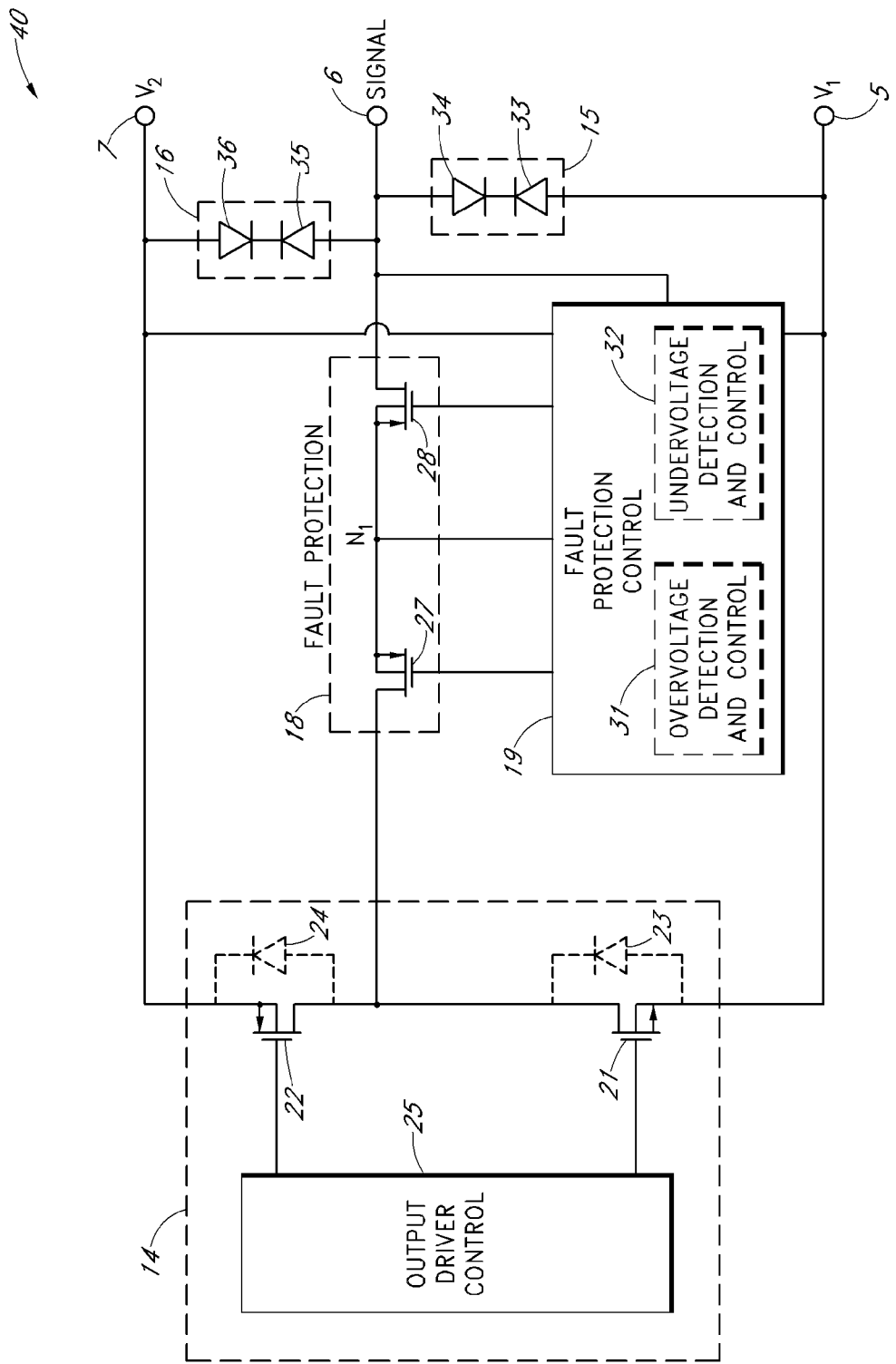
FIG. 2 is a circuit diagram of one embodiment of an amplifier integrated circuit (IC).

FIG. 2 is a circuit diagram of one embodiment of an interface amplifier IC or IC 40. The IC 40 includes the power low supply voltage pin 5, the signal pin 6, the power high supply voltage pin 7, an amplifier 14, a first rectifier 15, a second rectifier 16, a fault protection circuit 18, and a fault protection control circuit 19.

The fault protection circuit 18 includes a first fault protection PMOS transistor 27 and a second fault protection PMOS transistor 28. The first fault protection PMOS transistor 27 includes a drain electrically connected to the output of the amplifier 14. The first fault protection PMOS transistor 27 further includes a body and a source electrically connected to a body and a source of the second fault protection PMOS transistor 28 and to a first input of the fault protection control block 19 at a node $N_1$. The first fault protection PMOS transistor 27 further includes a gate electrically connected to first output of the fault protection control block 18. The second fault protection PMOS transistor 28 further includes a drain electrically connected to the signal pin 6 and to a second input of the fault protection control block 19. The second fault protection PMOS transistor 28 further includes a gate electrically connected to a second output of the fault protection control block 19. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The amplifier 14 includes a driver NMOS transistor 21, a driver PMOS transistor 22, and an output driver control block 25. The driver NMOS transistor 21 includes a source and body electrically connected to the power low supply voltage pin 5 and a gate electrically connected to a first output of the output driver control block 25. The driver PMOS transistor 22 includes a source and a body electrically connected to the power high supply voltage pin 7 and a gate electrically connected to a second output of the output driver control block 25. The driver NMOS transistor 21 further includes a drain electrically connected to a drain of the driver PMOS transistor 22 at an output of the amplifier 14. The output of the amplifier 14 is electrically connected to the signal pin 6 through the fault protection circuit 18. As shown in FIG. 2, the amplifier 14 can include a first parasitic diode 23 associated with a drain-to-body junction of the driver NMOS transistor 21 and a second parasitic diode 24 associated with a drain-to-body junction of the driver PMOS transistor 22.

The amplifier 14 can be used to control a voltage level of the signal pin 6. For example, when the first and second fault protection PMOS transistors 27, 28 are turned on by the fault protection control circuit 19, the amplifier 14 can control a voltage level of the signal pin 6 by using the output driver control block 25 to source current using the driver PMOS transistor 22 and/or to sink current using the driver NMOS transistor 21. The first and second fault protection PMOS transistors 27, 28 should be sufficiently large so as to have a relatively low ON state $R_{DS}$ so that the voltage headroom when the amplifier 14 is sinking or sourcing current to or from the signal pad 6 is not significantly affected.

The first and second bi-directional blocking clamps 15, 16 can be used to limit a voltage swing of the signal pad 6. The first bi-directional blocking clamp 15 includes a first blocking junction 33 and a second blocking junction 34. The first blocking junction 33 includes an anode electrically connected to the power low supply voltage pin 5 and a cathode electrically connected to a cathode of the second blocking junction 34. The second blocking junction 34 further includes an anode electrically connected to the signal pin 6. The second bi-directional blocking clamp 16 includes a third blocking junction 35 and a fourth blocking junction 36. The third blocking junction 35 includes an anode electrically connected to the signal pin 6 and a cathode electrically connected to a cathode of the fourth blocking junction 36. The fourth blocking junction 36 further includes an anode electrically connected to the power high supply voltage pin 7.

The fault protection control circuit 19 can be used to control a state of the fault protection circuit 18 so as to protect the output of the amplifier 14 from overvoltage and undervoltage conditions on the signal pad 6. For example, turning off the first and/or second fault protection PMOS transistors 27, 28 during an overvoltage or undervoltage condition on the signal pin 6 can help provide a high impedance between the output of the amplifier 14 and the signal pin 6. Since overvoltage and/or undervoltage conditions on the output of the amplifier 14 can lead to damage associated with forward-biasing the first and/or second parasitic diodes 23, 24 of the amplifier 14, the fault protection control circuit 19 can be used to protect the amplifier 14 from damage associated with fault conditions on the signal pin 6. During normal operation of the amplifier 14, the fault protection control circuit 19 can be configured to turn on the first and second fault protection PMOS transistors 18, 19 so that the amplifier 14 can control a voltage level of the signal pin 6.

During an overvoltage condition on the signal pin 6, the fault protection control circuit 19 can be configured to turn on or keep on the second fault protection PMOS transistor 28 and to turn off the first fault protection PMOS transistor 27. Controlling the first and second fault protection PMOS transistors 27, 28 during an overvoltage condition in this manner can prevent the overvoltage condition from damaging the amplifier 14 by limiting the voltage across and current through the driver NMOS transistor 21 and the driver PMOS transistor 22. Additionally, turning on the second fault protection PMOS transistor 28 during the overvoltage condition allows the voltage level of the bodies of the first and second fault protection PMOS transistors 27, 28 to be relatively close to a voltage level of the signal pin 6, thereby helping to prevent drain-to-body parasitic diodes of the first and second fault protection PMOS transistors 27, 28 from becoming forward-biased during the overvoltage condition. For example, configuring the fault protection circuit 18 in this manner can provide enhanced performance relative to a scheme in which the second fault protection PMOS transistor 28 is turned off during an overvoltage condition, which can result in the drain-to-body parasitic diode of the second fault protection PMOS transistor 28 activating during the overvoltage condition.

During an undervoltage condition on the signal pin 6, the fault protection control circuit 19 can turn on or leave on the first fault protection PMOS transistor 27 and turn off the second fault protection PMOS transistor 28, which can help protect the amplifier 14 from excessive voltage and/or excessive current conditions as well as to help prevent parasitic diodes associated with the first and second fault protection PMOS transistors 27, 28 from activating. For example, by turning off the second fault protection PMOS transistor 28 and by turning on the first fault protection PMOS transistor 27 during an undervoltage condition on the signal pin 6, the amplifier 14 can control an electrical potential of the bodies of the first and second fault protection PMOS transistors 27, 28 during the undervoltage condition. Since the voltage level of the signal pin 6 can be relatively low during an undervoltage condition, configuring the first and second fault protection PMOS transistors 27, 28 in this manner can prevent the drain-to-body parasitic diodes of the first and second fault protection PMOS transistors 27, 28 from activating during the undervoltage condition. For example, configuring the fault protection control block 19 to turn off the second fault protection PMOS transistor 28 and turn on the first fault protection PMOS transistor 27 during an undervoltage condition can provide enhanced performance relative to a scheme in which both the first and second fault protection PMOS transistors 27, 28 are turned off during the undervoltage condition, which can result in the drain-to-body parasitic diode of the first fault protection PMOS transistor 27 activating during the undervoltage condition.

In one embodiment, the fault protection control circuit 19 includes an overvoltage detection and control circuit 31 and an undervoltage detection and control circuit 32. During normal operation, the overvoltage detection and control circuit 31 is configured to turn on the first fault protection PMOS transistor 27 and the undervoltage detection and control circuit 32 is configured to turn on the second fault protection PMOS transistor 28. Additionally, the overvoltage detection and control circuit 31 is configured to detect an overvoltage condition associated with a voltage level of the signal pin 6 exceeding a voltage level of the power high supply voltage pin 7 by a first threshold voltage, and to turn off the first fault protection PMOS transistor 27 when the overvoltage condition is detected. Furthermore, the undervoltage detection and control circuit 32 is configured to detect an undervoltage condition associated with the voltage level of the signal pin 6 falling below a voltage level of the power low supply voltage pin 5 by a second threshold voltage, and to turn off the second fault protection PMOS transistor 28 when the undervoltage condition is detected. In one embodiment, the first threshold voltage is selected to be in the range of about 1 V to about 2 V, and the second threshold voltage is selected to be in the range of about 1 to about 2 V.

The fault protection circuit 18 illustrated in FIG. 2 includes PMOS transistors rather than NMOS transistors. Although NMOS transistors can alternatively be used as described later in connection with FIG. 7, using PMOS transistors can provide enhanced performance relative to certain schemes using NMOS transistors, because NMOS transistors can include drain-to-substrate parasitic diodes that can activate or become forward-biased when the voltage level of the signal pin 6 falls below the voltage level of the power low supply voltage pin $V_1$. Although the first and second PMOS transistors 27, 28 can include drain-to-body parasitic diodes as was described earlier, the fault protection control circuit 19 can control the voltage level of the gates of the first and second PMOS transistors 27, 28 during overvoltage and undervoltage conditions on the signal pin 6 so as to prevent the drain-to-body parasitic diodes from becoming forward-biased.

In one embodiment, the first and second fault protection PMOS transistors 27, 28 are p-type laterally diffused metal oxide semiconductor (LDMOS) devices. Configuring the first and second PMOS transistors as LDMOS devices can aid in increasing a maximum voltage that the first and second PMOS transistors can withstand during a fault condition.

Figure 3A:
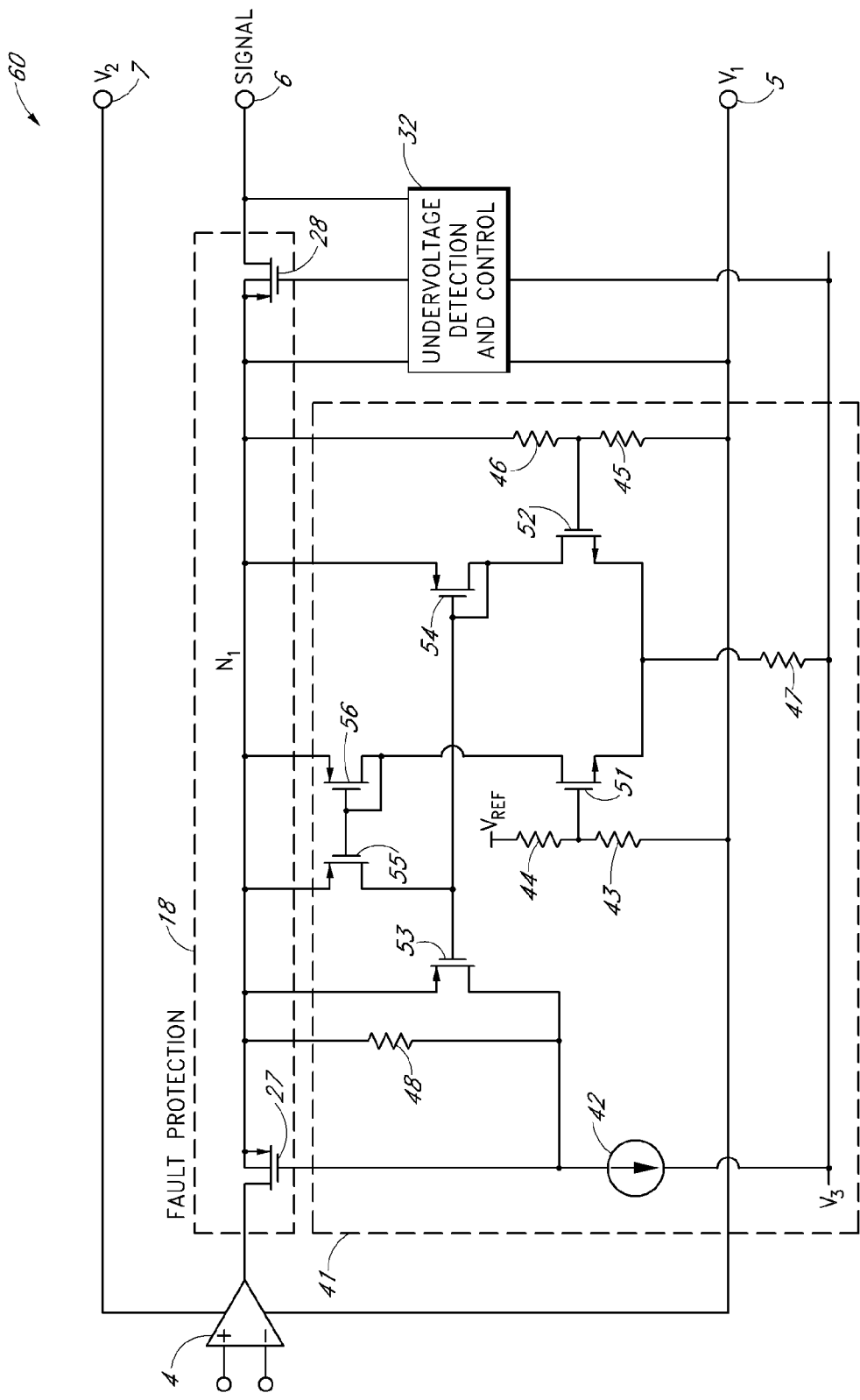
FIG. 3A is a circuit diagram of an interface amplifier IC including one embodiment of an overvoltage detection and control circuit.

FIG. 3A is a circuit diagram of an amplifier interface IC or IC 60 including one embodiment of an overvoltage detection and control circuit. The IC 60 includes the amplifier 4, the power low supply voltage pin 5, the signal pin 6, the power high supply voltage pin 7, and the fault protection circuit 18, which can be as described earlier with respect to FIGS. 1 and 2. Furthermore, the IC 60 includes a fault protection control circuit that includes an overvoltage detection and control circuit 41 and an undervoltage detection and control circuit 32.

The overvoltage detection and control circuit 41 includes a high voltage current source 42, first to sixth resistors 43-48, first and second NMOS transistors 51, 52, and first to fourth PMOS transistors 53-56. As used herein, "high voltage" can refer to for example, transistors or other circuitry configured to withstand voltages in the range of about 20 V to about 100 V, for instance, 40 V, while "low voltage" can refer to transistors or other circuitry configured to withstand voltages in the range of about 1 V to about 6 V, for instance, 5 V. The high voltage current source 42 includes a first terminal electrically connected to a third voltage supply $V_3$ and a second terminal electrically connected to a gate of the first fault protection PMOS transistor 27, to a first end of the sixth resistor 48, and to a drain of the first PMOS transistor 53. The sixth resistor 48 further includes a second end electrically connected to the node $N_1$ of the fault protection circuit 18. The first PMOS transistor 53 further includes a source electrically connected to the node $N_1$ and a gate electrically connected to a drain of the third PMOS transistor 55, to a gate and drain of the second PMOS transistor 54, and to a drain of the second NMOS transistor 52. The second PMOS transistor 54 further includes a source electrically connected to the node $N_1$. The third PMOS transistor 55 further includes a source electrically connected to the node $N_1$ and a gate electrically connected to a gate and to a drain of the fourth PMOS transistor 56 and to a drain of the first NMOS transistor 51. The fourth PMOS transistor 56 further includes a source electrically connected to the node $N_1$.

The first NMOS transistor 51 further includes a gate electrically connected to a first end of the first resistor 43 and to a first end of the second resistor 44. The first NMOS transistor 51 further includes a source electrically connected to a source of the second NMOS transistor 52 and to a first end of the fifth resistor 47. The second resistor 44 further includes a second end electrically connected to a reference voltage $V_{REF}$, which can be derived from the power high supply voltage pin 7. The second resistor 43 further includes a second end electrically connected to the power low supply voltage pin 5. The fifth resistor 47 further includes a second end electrically connected to the third supply voltage $V_3$. The second NMOS transistor 52 further includes a gate electrically connected to a first end of the third resistor 45 and to a first end of the fourth resistor 46. The third resistor 45 further includes a second end electrically connected to the power low supply voltage pin 5. The fourth resistor 46 further includes a second end electrically connected to the node $N_1$.

The overvoltage detection and control circuit 41 can enable or turn on the first fault protection PMOS transistor 27 when no overvoltage condition is detected on the signal pin 6. However, when an overvoltage condition is detected, the overvoltage detection and control circuit 41 can turn off the first fault protection PMOS transistor 27 to prevent a large amount of current from flowing from the signal pin 6 into the output of the amplifier 4.

The first and second NMOS transistors 51, 52 can be used to compare a first voltage generated using a first voltage divider that includes the first and second resistors 43, 44 to a second voltage generated using a second voltage divider that includes the third and fourth resistors 45, 46. For example, the first and second resistors 43, 44 can be used to generate the first voltage based on a voltage level of the reference voltage $V_{REF}$ and the third and fourth resistors 45, 46 can be used to generate the second voltage based on a voltage level of the signal pin 6. By selecting a voltage level of the reference voltage $V_{REF}$ and the resistances of the first to fourth resistors 43-46, the overvoltage detection and control circuit 41 can be configured to detect an overvoltage condition of a desired magnitude, such as a voltage that is about 1 V to about 2 V greater than a nominal operating voltage of the signal pin 6. The fifth resistor 47 can provide a bias current to the first and second NMOS transistors 51, 52, and a resistance of the fifth resistor 47 can be selected to help achieve a desired comparison response time of the first and second NMOS transistors 51, 52.

In one embodiment, the resistances of the third and fourth resistors 45, 46 are selected to be relatively large, such as a combined series resistance greater than about 1 mega-Ω. Configuring the resistances of the third and fourth resistors 45, 46 to be relatively large can aid in achieving a leakage current specification of the signal pin 6, such as a leakage current specification of less than about 10 μA when the signal pin 6 is at about 5 V.

When an overvoltage condition is detected on the signal pin 6, a current through the second NMOS transistor 52 can exceed a current through the first NMOS transistor 51, and the second NMOS transistor 52 can use the first and second PMOS transistors 53, 54 to pull up the gate voltage of the first fault protection PMOS transistor 27 such that the first fault protection PMOS transistor 27 is turned off. However, when no overvoltage condition is detected, the current through the first NMOS transistor 51 can exceed the current through the second NMOS transistor 52, and the first NMOS transistor 51 can use the third and fourth PMOS transistors 55, 56 to turn off the first and second PMOS transistors 53, 54, which can result in the high voltage current source 42 pulling down the gate voltage of the first fault protection PMOS transistor 27. For example, when the first and second PMOS transistors 53, 54 are turned off, a current of the high voltage current source 42 can flow through the sixth resistor 48, and the gate-to-source voltage of the first fault protection PMOS transistor 27 can be about equal to the voltage drop across the sixth resistor 48.

Including the third and fourth PMOS transistors 55, 56 can help minimize standing leakage current by ensuring that the first and second PMOS transistors 53, 54 are turned off during normal operation. In one embodiment, the first PMOS transistor 53 is sized to be relatively large so as to provide a relatively fast slew rate for the gate of the first fault protection PMOS transistor 27 during an overvoltage condition.

During an overvoltage condition on the signal pin 6, the second fault protection PMOS transistor 28 can be turned on by the undervoltage detection and control block 32. Turning on the second fault detection PMOS transistor 28 during an overvoltage condition on the signal pin 6 can prevent a drain-to-body parasitic diode associated with the second fault protection PMOS transistor 28 from activating during an overvoltage condition.

In the configuration shown in FIG. 3A, the overvoltage detection and control circuit 41 is biased or powered using the signal pin 6, which can allow the overvoltage detection and control circuit 41 to function even when power high supply voltage pin 7 is floating. Additionally, configuring the overvoltage detection and control circuit 41 in this manner can aid in dynamically biasing the overvoltage detection and control circuit 41 based on a magnitude of the overvoltage condition. For example, when the voltage level of the signal pin 6 exceeds normal operating conditions by a relatively small amount, a current from the signal pin 6 provided to the overvoltage detection and control circuit 41 through the second fault protection PMOS transistor 28 can be relatively small. However, when the voltage level of the signal pin 6 exceeds normal operating conditions by a relatively large amount, such as when a transient event defined by the ISO-7637-3 specification is received on the signal pin 6, the overvoltage detection and control circuit 41 can be biased with a relatively large current and can turn off the first fault protection PMOS transistor 27 relatively rapidly. Since a gate capacitance associated with the first fault protection PMOS transistor 27 can be relatively large, dynamically adjusting the current provided to the overvoltage detection and control circuit 41 can aid in reducing power consumption.

The third voltage supply $V_3$ can be used as a power low supply voltage for components of the overvoltage and undervoltage detection and control circuits 41, 32 that are used to control the gate voltages of the first and second fault protection PMOS transistors 27, 28. For example, the third voltage supply $V_3$ has been used as a power low supply voltage for the high voltage current source 42, which is used to control a gate voltage of the first fault protection PMOS transistor 27 when no overvoltage condition is detected on the signal pin 6. The voltage level of the third voltage supply $V_3$ can be selected to be less than that of the power low supply voltage pin 5. Configuring the third voltage supply $V_3$ in this manner can increase output voltage swing of the signal pin 6 by permitting the gate voltages of the first and second fault protection PMOS transistors 27, 28 to be controlled to voltage levels below that of the power low supply voltage pin 5. Although FIG. 3A illustrates a configuration including the third voltage supply $V_3$, the third voltage supply $V_3$ can be omitted in certain implementations, such as configurations having reduced output voltage swing on the signal pin 6 and/or configurations in which the first and second fault protection PMOS transistors 27, 28 are depletion mode MOS transistors or other field-effect transistors (FETs).

In the illustrated configuration, the third voltage supply $V_3$ is also used as a power low supply voltage for the fifth resistor 47. The fifth resistor 47 can be used to provide a bias current the changes in relation to a voltage of the signal pin 6 even when the power supply pins are misconnected and/or floating, thereby enhancing fault condition detection. For example, when the power supply pins are misconnected, floating, or a combination thereof, a voltage level of the signal pin 6 can rise above the power high supply voltage pin 7 and lead to an overvoltage condition that can be detected by the overvoltage detection and control circuit 41.

Figure 3B:
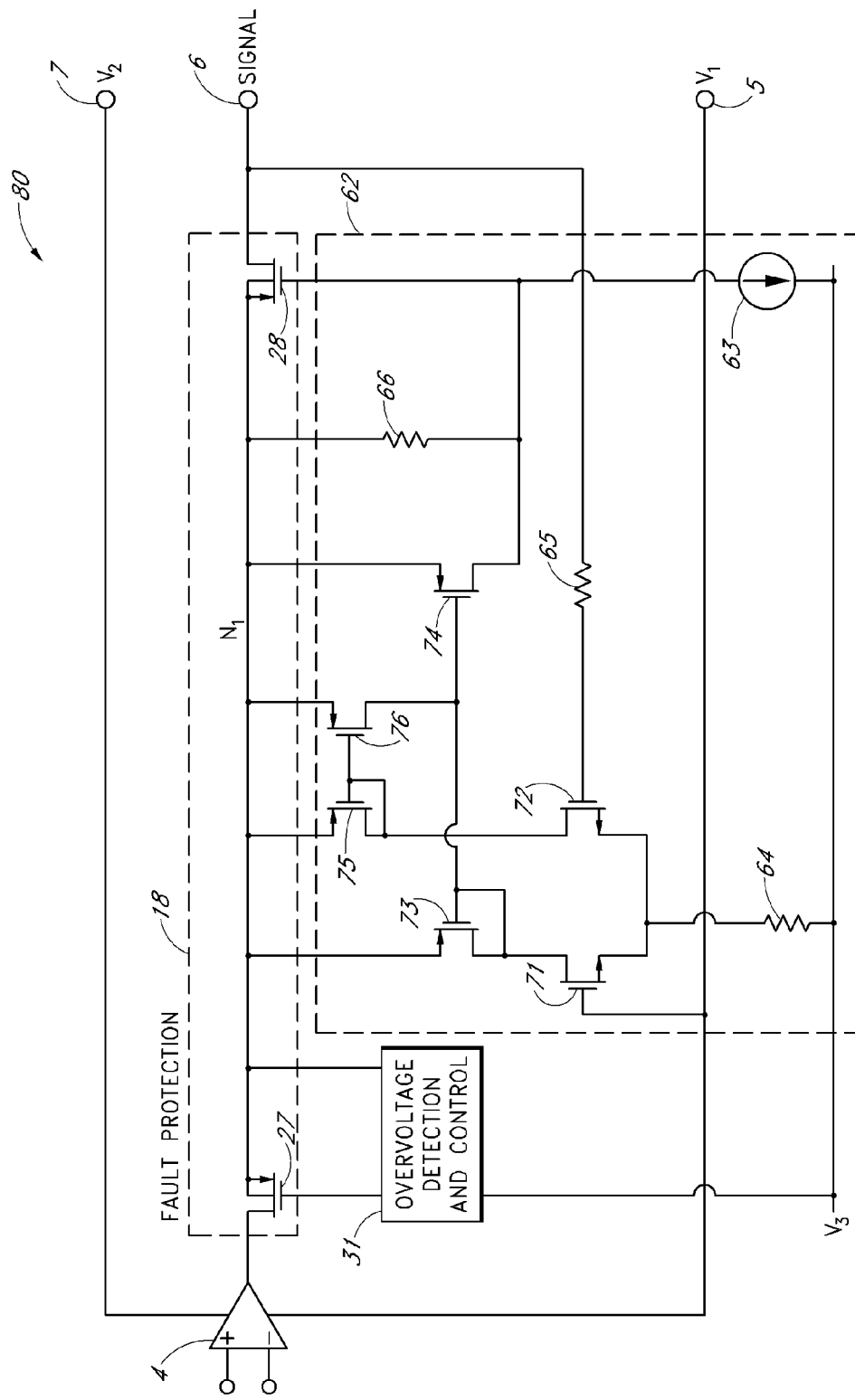
FIG. 3B is a circuit diagram of an interface amplifier IC including one embodiment of an undervoltage detection and control circuit.

FIG. 3B is a circuit diagram of an amplifier interface IC or IC 80 including one embodiment of an undervoltage detection and control circuit. The IC 80 includes the amplifier 4, the power low supply voltage pin 5, the signal pin 6, the power high supply voltage pin 7, and the fault protection circuit 18, which can be as described earlier. Furthermore, the IC 80 includes a fault protection control circuit that includes an overvoltage detection and control circuit 31 and an undervoltage detection and control circuit 62.

The undervoltage detection and control circuit 62 includes a high voltage current source 63, first to third resistors 64-66, first and second NMOS transistors 71, 72, and first to fourth PMOS transistors 73-76. The high voltage current source 63 includes a first terminal electrically connected to a third voltage supply $V_3$ and a second terminal electrically connected to a gate of the second fault protection PMOS transistor 28, to a first end of the third resistor 66, and to a drain of the second PMOS transistor 74. The third resistor 66 further includes a second end electrically connected to the node $N_1$ of the fault protection circuit 18. The second PMOS transistor 74 further includes a source electrically connected to the node $N_1$ and a gate electrically connected to a drain of the fourth PMOS transistor 76, to a gate and to a drain of the first PMOS transistor 73, and to a drain of the first NMOS transistor 71. The first PMOS transistor 73 further includes a source electrically connected to the node $N_1$. The fourth PMOS transistor 76 further includes a source electrically connected to the node $N_1$ and a gate electrically connected to a gate and to a drain of the third PMOS transistor 75 and to a drain of the second NMOS transistor 72. The third PMOS transistor 75 further includes a source electrically connected to the node $N_1$. The first NMOS transistor 71 further includes a gate electrically connected to the power low supply voltage pin 5 and a source electrically connected to a first end of the first resistor 64 and to a source of the second NMOS transistor 72. The first resistor 64 further includes a second end electrically connected to the third supply voltage $V_3$. The second NMOS transistor 72 further includes a gate electrically connected to a first end of the second resistor 65. The second resistor 65 further includes a second end electrically connected to the signal pin 6.

The undervoltage detection and control circuit 62 can enable or turn on the second fault protection PMOS transistor 28 when no undervoltage condition is detected on the signal pin 6. However, when an undervoltage condition is detected, the undervoltage detection and control circuit 62 can turn off the second fault protection PMOS transistor 28 to prevent a large amount of current from flowing from the signal pin 6 into the output of the amplifier 4.

The first and second NMOS transistors 71, 72 can be used to compare a first voltage associated with a voltage level of the power low supply voltage pin 5 to a second voltage associated with a voltage level of the signal pin 6. In certain implementations, the undervoltage detection and control block 62 is configured to detect an undervoltage condition associated with a voltage that is at least about 1 V to about 2 V less than a nominal operating voltage of the signal pin 6.

When the undervoltage condition is detected, a current through the first NMOS transistor 71 can exceed a current through the second NMOS transistor 72, and the first NMOS transistor 71 can use the first and second PMOS transistors 73, 74 to pull up the gate voltage of the second fault protection PMOS transistor 28 such that the second fault protection PMOS transistor 28 is turned off. However, when no undervoltage condition is detected, the current through the second NMOS transistor 72 can exceed the current through the first NMOS transistor 71, and the second NMOS transistor 72 can use the third and fourth PMOS transistors 75, 76 to turn off the first and second PMOS transistors 73, 74, which can result in the high voltage current source 63 pulling down the gate voltage of the second fault protection PMOS transistor 28. For example, when the first and second PMOS transistors 73, 74 are turned off, a current of the high voltage current source 63 can flow through the third resistor 66, and the gate-to-source voltage of the second fault protection PMOS transistor 28 can be about equal to the voltage drop across the third resistor 66.

During an undervoltage condition on the signal pin 6, the first fault protection PMOS transistor 27 can be turned on by the overvoltage detection and control block 31. Turning on the first fault protection PMOS transistor 27 during an undervoltage condition on the signal pin 6 can aid in avoiding activation of a drain-to-body parasitic diode associated with the first fault protection PMOS transistor 27 during an undervoltage condition.

As shown in FIG. 3B, the undervoltage detection and control circuit 62 can be powered using the signal pin 6, which can allow the undervoltage detection and control circuit 62 to function even when the power supply pins are misconnected, floating, or a combination thereof. Additionally, configuring the undervoltage detection and control circuit 62 in this manner can aid in dynamically biasing the undervoltage detection and control circuit 62 in response to an undervoltage condition. Additional details of the undervoltage detection and control circuit 62 of FIG. 3B can be similar to those described earlier with respect to the overvoltage detection and control circuit 41 of FIG. 3A.

Figure 4A:
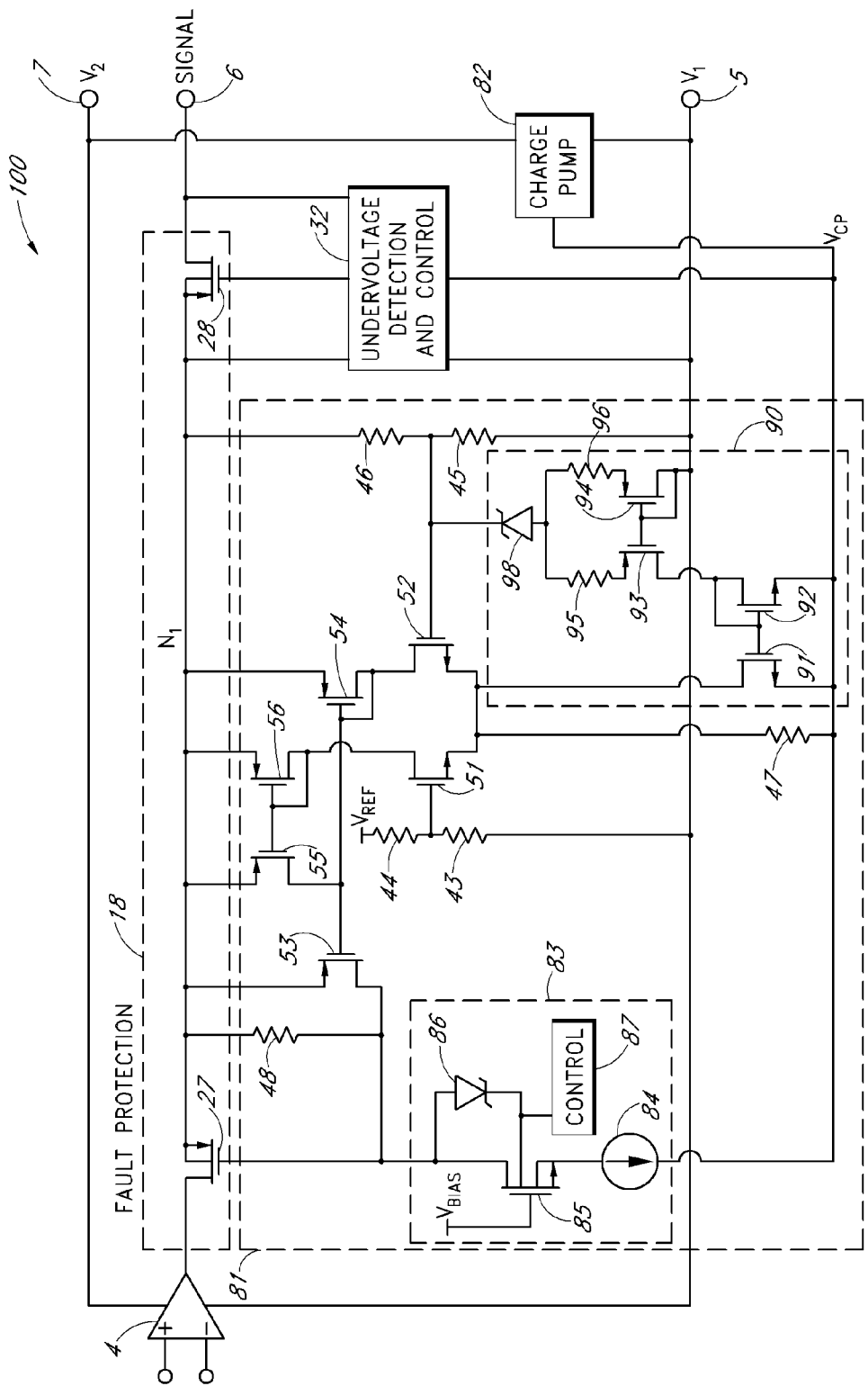
FIG. 4A is a circuit diagram of an interface amplifier IC including another embodiment of an overvoltage detection and control circuit.

FIG. 4A is a circuit diagram of an IC 100 including another embodiment of an overvoltage detection and control circuit. The IC 100 includes the amplifier 4, the power low supply voltage pin 5, the signal pin 6, the power high supply voltage pin 7, the fault protection circuit 18, the undervoltage detection and control block 32, an overvoltage detection and control block 81, and a charge pump 82.

The IC 100 of FIG. 4A is similar to the IC 60 of FIG. 3A, except that the IC 100 of FIG. 4A further includes the charge pump 82 and includes a different implementation of the overvoltage detection and control block.

The charge pump 82 can be a negative charge pump configured to generate a charge pump supply voltage $V_{CP}$ that has a voltage level less than a voltage level of the power low supply voltage pin 5. In certain implementations, the charge pump 82 is powered using the power high and power low supply voltage pins 5, 6. Including the charge pump 82 can aid in increasing the output voltage swing of the signal pad 6 by permitting the overvoltage and undervoltage detection and control circuits 81, 32 to control the voltage levels of the gates of the first and second fault protection PMOS transistors 27, 28 below the voltage level of the power low supply voltage pin 5.

The overvoltage detection and control circuit 81 includes first to sixth resistors 43-48, first and second NMOS transistors 51, 52, and first to fourth PMOS transistors 53-56, which can be as described earlier with respect to FIG. 3A. The overvoltage detection and control circuit 81 further includes a high voltage current source 83 and a transient response boosting circuit 90. The overvoltage detection and control circuit 81 is biased or powered using the signal pin 6, thereby allowing fault protection to be provided even when the power high supply voltage pin 7 and/or the power low supply voltage pin 5 are misconnected, floating, or a combination thereof. Additionally, the overvoltage detection and control circuit 81 has been configured to operate using dynamic biasing. For example, a current provided to the overvoltage detection and control circuit 81 is based on a magnitude of the overvoltage condition. As will be described further below, dynamic biasing can be enhanced by using the transient response boosting circuit 90.

The high voltage current source 83 includes a current source 84, an n-type LDMOS (NLDMOS) transistor 85, a Zener diode 86, and a current source control block 87. The NLDMOS transistor 85 includes a gate electrically connected to a bias voltage $V_{BIAS}$ and a body and a source electrically connected to a first terminal of the current source 84. The current source 84 further includes a second terminal electrically connected to the charge pump voltage $V_{CP}$. The NLDMOS transistor 85 further includes a drain electrically connected to a gate of the first fault protection PMOS transistor 27 and to an anode of the Zener diode 86. Additionally, the NLDMOS transistor 85 further includes an n-type isolation region or tub electrically connected to a cathode of the Zener diode 86 and to an output of the current source control block 87.

The n-type tub of the NLDMOS transistor 85 can include an n-type buried layer (NBL) and one or more high voltage wells configured to electrically isolate the body of the NLDMOS transistor 85 from a substrate on which the device is formed. In certain implementations, a deep p-well is used to electrically isolate the drain of the NLDMOS transistor 85 from the n-type tub of the NLDMOS transistor 85, thereby permitting the drain and the n-type tub to operate at different electrical potentials, which can aid in preventing a parasitic diode between the n-type tub and the substrate from clamping when the drain voltage falls below the substrate voltage. The high voltage current source 83 includes the current source control block 87, which can be used to control an electrical potential of the n-type tub of the NLDMOS transistor 85 so as to achieve a desired performance characteristic of the high voltage current source 83.

Although electrically isolating the drain of the NLDMOS transistor 85 from the n-type tub of the NLDMOS transistor 85 can permit the drain and n-type tub to operate at different electrical potentials, a breakdown voltage between the drain and the n-type tub can be relatively low. For example, when using a deep p-well to isolate the drain and the n-type tub, a PNP parasitic bipolar transistor associated with the drain, the deep p-well, and the n-type tub can breakdown when the voltage of the n-type tub exceeds a voltage of the drain by a relatively small voltage, such as a voltage of about 10 V. Since breakdown between the drain and the n-type tub can damage the NLDMOS transistor 85, the illustrated configuration includes the Zener diode 86 disposed between the drain and the n-type tub of the NLDMOS transistor 85. The Zener diode 86 can be configured to have a breakdown voltage less than a breakdown voltage between the drain and the n-type tub of the NLDMOS transistor 85, thereby preventing the NLDMOS transistor 85 from being damaged when transient signaling conditions result in the voltage of the n-type tub exceeding the voltage of the drain of the NLDMOS transistor 85.

The transient response boosting circuit 90 includes first and second boost NMOS transistors 91, 92, first and second boost PMOS transistors 93, 94, first and second boost resistors 95, 96, and a boost Zener diode 98. The first boost NMOS transistor 91 includes a source electrically connected to the charge pump voltage $V_{CP}$ and a drain electrically connected to the source of the second NMOS transistor 52. The first boost NMOS transistor 91 further includes a gate electrically connected to a gate and to a drain of the second boost NMOS transistor 92 and to a drain of the first boost PMOS transistor 93. The second boost NMOS transistor 92 further includes a source electrically connected to the charge pump voltage $V_{CP}$. The first boost PMOS transistor 93 further includes a source electrically connected to a first end of the first boost resistor 95 and a gate electrically connected to the first power low supply voltage pin 5. The first boost resistor 95 further includes a second end electrically connected to a first end of the second boost resistor 96 and to an anode of the boost Zener diode 98. The boost Zener diode 98 further includes a cathode electrically connected to the gate of the second NMOS transistor 52. The second boost resistor 96 further includes a second end electrically connected to a source of the second boost PMOS transistor 94. The second boost PMOS transistor 94 further includes a gate and a drain electrically connected to the power low supply voltage pin 5.

The transient response boosting circuit 90 can aid in enhancing the transient response time of the overvoltage detection and control circuit 81 in response to an overvoltage condition on the signal pin 6. For example, when the gate voltage of the second NMOS transistor 52 increases during an overvoltage condition, the transient response boosting circuit 90 can activate and pull down the source voltage of the second NMOS transistor 52 so as to speed-up the transient response of the overvoltage detection and control circuit 81. In one embodiment, the overvoltage detection and control circuit 81 is configured to use the transient response boosting circuit 90 to pull up a gate voltage of the first fault protection PMOS transistor 27 at a slew rate that is faster than a rise time of the transient signal on the signal pin 6, for instance, a rise time of up to about 85V/μS for a transient electrical event defined by the ISO-7637-2 specification.

Figure 4B:
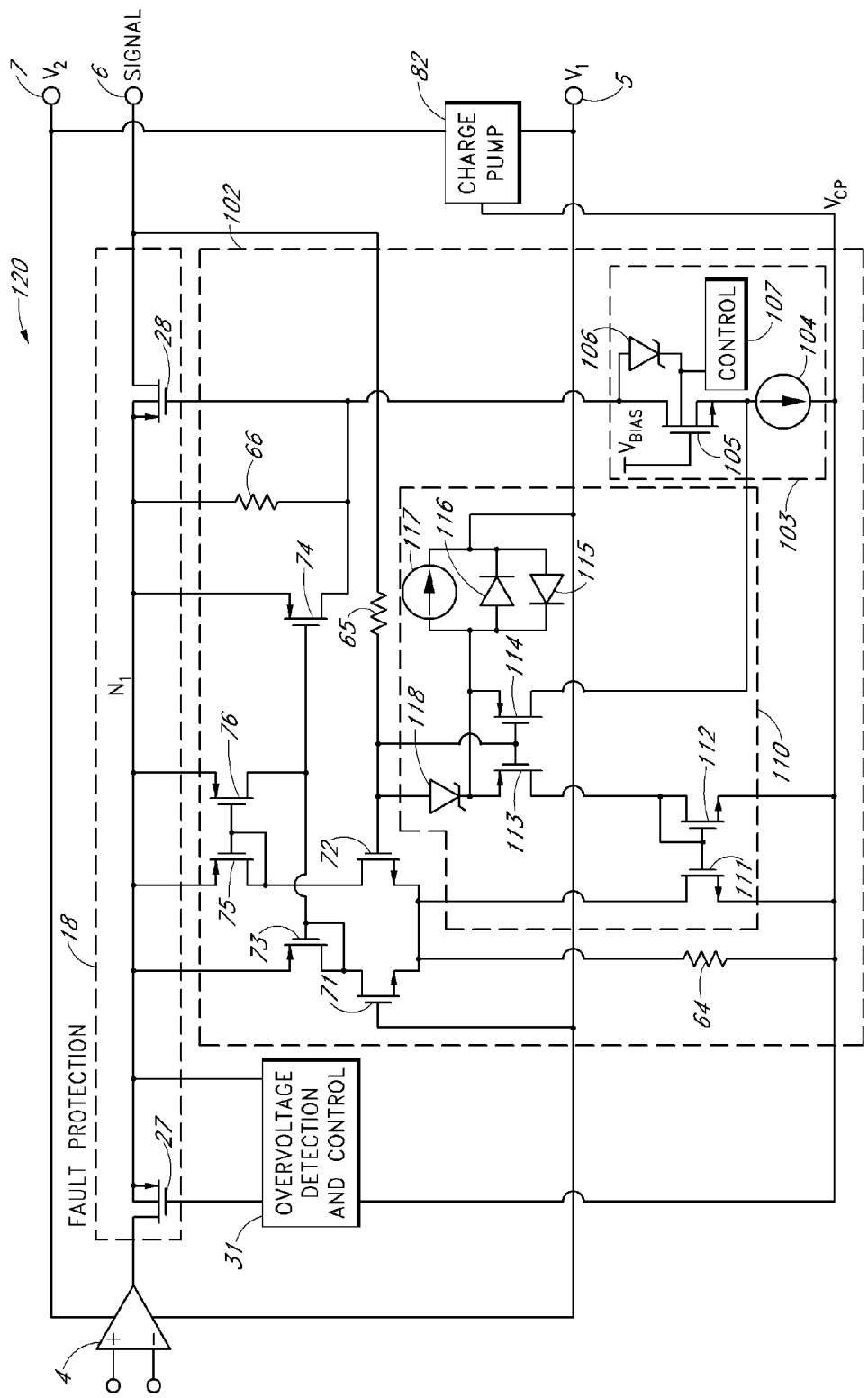
FIG. 4B is a circuit diagram of an interface amplifier IC including another embodiment of an undervoltage detection and control circuit.

FIG. 4B is a circuit diagram of an IC 120 including another embodiment of an undervoltage detection and control circuit. The IC 120 includes the amplifier 4, the power low supply voltage pin 5, the signal pin 6, the power high supply voltage pin 7, the fault protection circuit 18, the overvoltage detection and control circuit 31, the charge pump 82, and an undervoltage detection and control circuit 102.

The IC 120 of FIG. 4B is similar to the IC 80 of FIG. 3B, except that the IC 120 of FIG. 4B further includes the charge pump 82 and includes a different implementation of the undervoltage detection and control block. The charge pump 82 can be used to generate the charge pump supply voltage $V_{CP}$, which can be as described earlier with respect to FIG. 4A.

The undervoltage detection and control circuit 102 includes first to third resistors 64-66, first and second NMOS transistors 71, 72, and first to fourth PMOS transistors 73-76, which can be as described earlier with respect to FIG. 3A. The undervoltage detection and control circuit 102 further includes a high voltage current source 103 and a transient response boosting circuit 110.

The high voltage current source 103 includes a current source 104, an NLDMOS transistor 105, a Zener diode 106, and a current source control block 107. The NLDMOS transistor 105 includes a gate electrically connected to a bias voltage $V_{BIAS}$ and a body and source electrically connected to a first terminal of the current source 104. The current source 104 further includes a second terminal electrically connected to the charge pump voltage $V_{CP}$. The NLDMOS transistor 105 further includes a drain electrically connected to a gate of the second fault protection PMOS transistor 28 and to an anode of the Zener diode 106. Additionally, the NLDMOS transistor 105 further includes an n-type tub electrically connected to a cathode of the Zener diode 106 and to an output of the current source control block 107. Additional details of the high voltage current source 103 of FIG. 4B can be similar to those described earlier with respect to the high voltage current source 83 of FIG. 4A.

The transient response boosting circuit 110 includes first and second boost NMOS transistors 111, 112, first and second boost PMOS transistors 113, 114, a boost Zener diode 118, first and second boost diodes 115, 116, and a boost current source 117. The first boost NMOS transistor 111 includes a source electrically connected to the charge pump voltage $V_{CP}$ and a drain electrically connected to a source of the first NMOS transistor 71. The first boost NMOS transistor 111 further includes a gate electrically connected to a gate and to a drain of the second boost NMOS transistor 112 and to a drain of the first boost PMOS transistor 113. The second boost NMOS transistor 112 further includes a source electrically connected to the charge pump voltage $V_{CP}$. The first boost PMOS transistor 113 further includes a gate electrically connected to a gate of the second boost PMOS transistor 114 and to a gate of the second NMOS transistor 72. The first boost PMOS transistor 113 further includes a source electrically connected to a source of the second boost PMOS transistor 114, to a cathode of the boost Zener diode 118, to a first terminal of the boost current source 117, to a cathode of the first boost diode 115, and to an anode of the second boost diode 116. The boost Zener diode 118 further includes an anode electrically connected to a gate of the second NMOS transistor 72. The boost current source 117 further includes a second terminal electrically connected to the power low supply voltage pin 5, to an anode of the first boost diode 115, and to a cathode of the second boost diode 116. The second boost PMOS transistor 114 further includes a drain electrically connected to the body and source of the NLDMOS transistor 105 and to the first terminal of the current source 104.

The transient response boosting circuit 110 can aid in enhancing the transient response time of the undervoltage detection and control circuit 102 in response to an undervoltage condition on the signal pin 6. For example, when the gate voltage of the second NMOS transistor 72 decreases in response to an undervoltage condition, the transient response boosting circuit 110 can activate and pull down the source voltage of the first NMOS transistor 71 so as to expedite the transient response of the undervoltage detection and control circuit 102. In one embodiment, the undervoltage detection and control circuit 102 is configured to use the transient response boosting circuit 90 to pull up a gate voltage of the second fault protection PMOS transistor 28 at a slew rate that is faster than a rise time of the transient signal on the signal pin 6, for instance, a rise time of up to about 85V/μS for a transient electrical event defined by the ISO-7637-2 specification.

The first boost diode 115 can be used to help reduce leakage current of the boost Zener diode 118 when the voltage level of the signal pin 6 is relatively high by increasing the boost Zener diode's effective Zener voltage between the signal pin 6 and the power low supply voltage pin 5. The boost current source 117 has been included to reduce leakage of the second boost PMOS transistor 114 when the signal pin 6 has a low voltage close to the voltage level of the power low supply voltage pin 5. For example, when the boost current source 117 is omitted the second boost PMOS transistor 114 can operate in a sub-threshold region when the voltage level of the signal pin 6 is relatively low. Furthermore, the second boost diode 116, which has been configured to be anti-parallel to the first boost diode 115, can be used to help protect transistors used to implement the boost current source 117 from overstress when the power low and power high supply voltage pins 5, 7 are misconnected, floating, or a combination thereof. For example, the first and second boost diodes 115, 116 can be used to limit the magnitude of the voltage across the boost current source 117 to be about equal to a diode forward voltage drop even during undervoltage fault conditions.

Figure 5:
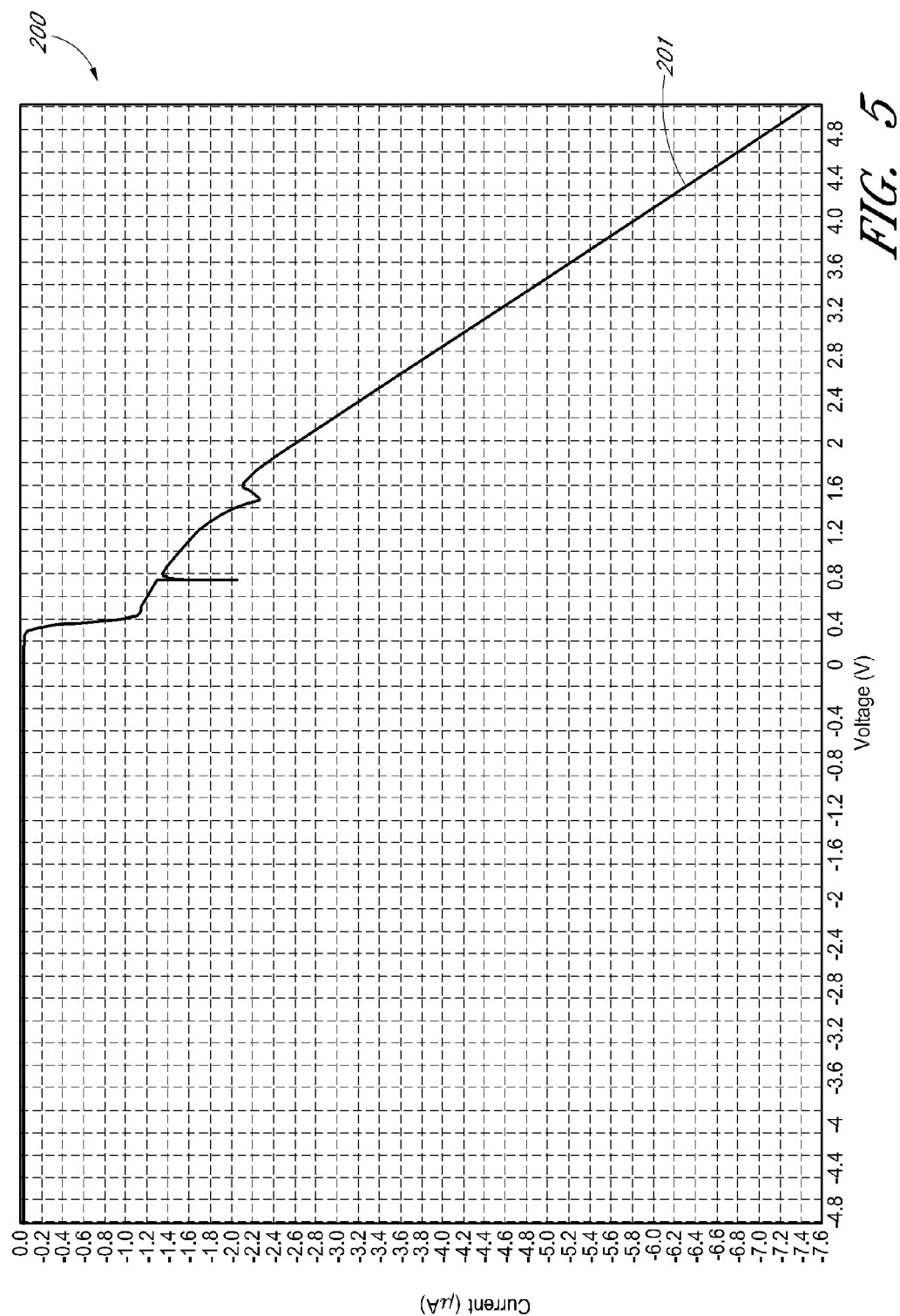
FIG. 5 is a graph of one example of leakage current versus pin voltage.

FIG. 5 is a graph 200 of one example of leakage current versus pin voltage. The graph 200 includes a plot 201 of leakage current versus voltage of the signal pin 6 for one embodiment of the IC 40 of FIG. 2. As illustrated in FIG. 5, the signal pin 6 can be configured to have a leakage current of less than 10 µA over an operating voltage range of the signal pin 6 extending between about −5 V and about 5 V. Thus, fault protection circuitry can be used in low leakage applications, such as 5V automotive ratiometric signaling specifications.

Figure 6A:
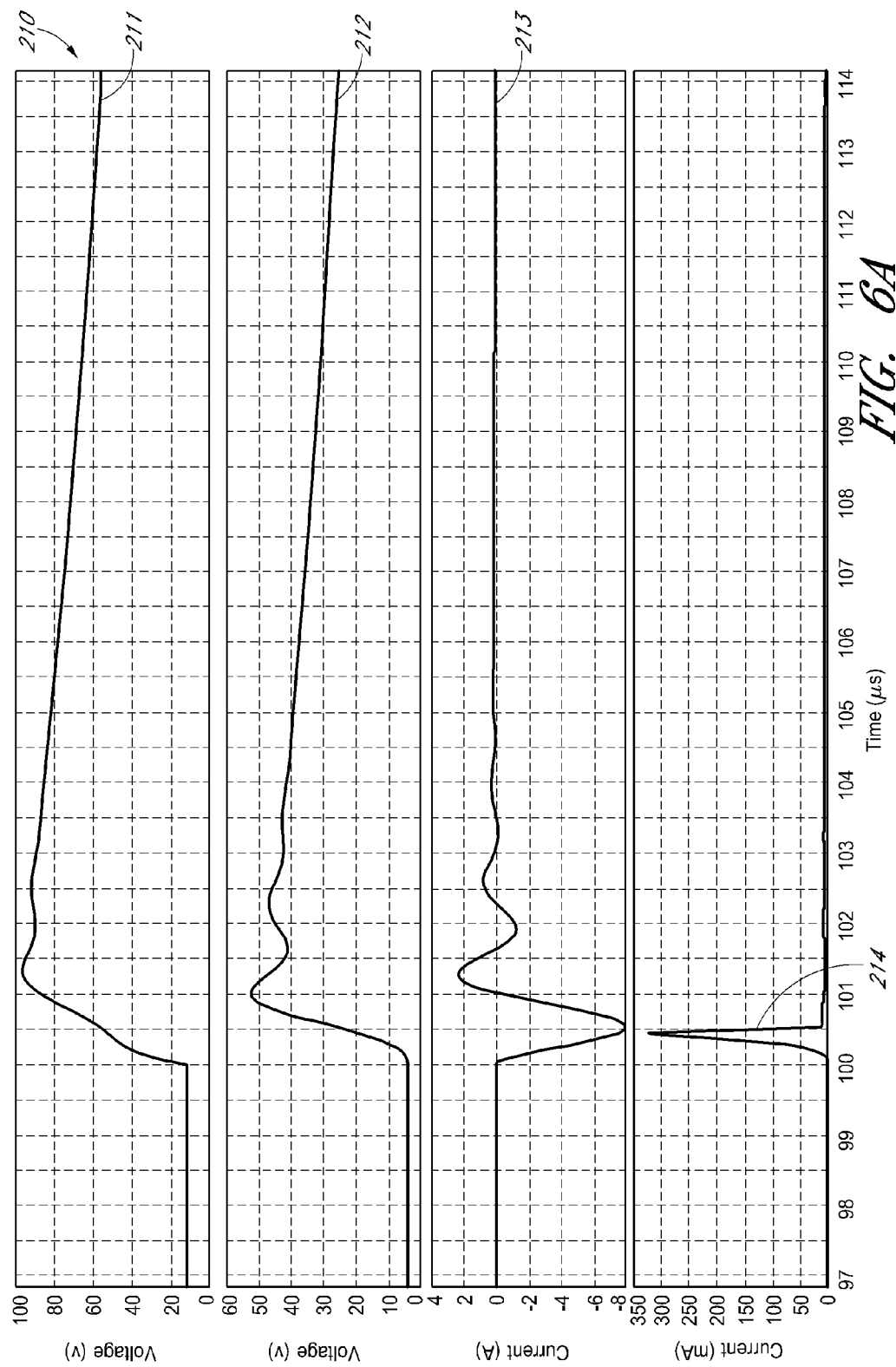
FIGS. 6A and 6B are graphs of two examples of transient simulations.
Figure 6B:
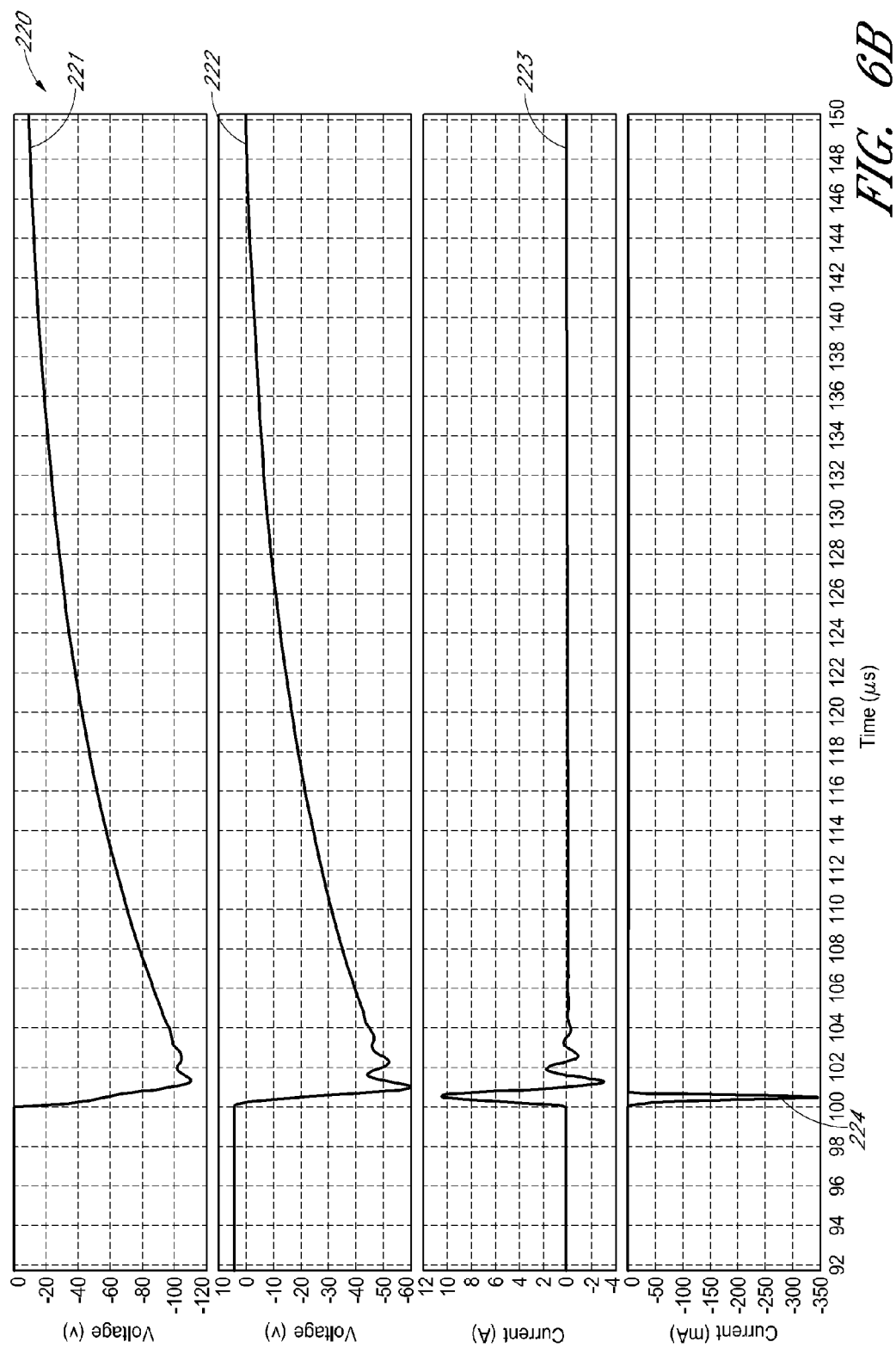

FIGS. 6A and 6B are graphs of two examples of transient simulations for a fault protection circuit. FIG. 6A is a graph 210 of an overvoltage transient simulation for one embodiment of the electronic amplification system 10 of FIG. 1. The graph 210 includes a first plot 211 of voltage versus time for a portion of the interface 3 receiving an overvoltage condition and a corresponding third plot 213 of current versus time for the portion of the interface 3. The graph 210 further includes a second plot 212 of voltage versus time for the signal pin 6 of the IC 1 and fourth plot 214 of current versus time for the output of the amplifier 4. As shown in FIG. 6A, the fault protection circuit 8 and the fault protection control circuit 9 can be used to protect the output of the amplifier 4 from high levels of current during an overvoltage condition on the signal pin 6.

FIG. 6B is a graph 220 of an undervoltage transient simulation for one embodiment of the electronic amplification system 10 of FIG. 1. The graph 220 includes a first plot 221 of voltage versus time for a portion of the interface 3 receiving an undervoltage condition and a corresponding third plot 223 of current versus time for the portion of the interface 3. The graph 220 further includes a second plot 222 of voltage versus time for the signal pin 6 and a fourth plot 224 of current versus time for the output of the amplifier 4. As shown in FIG. 6B, the fault protection circuit 8 and the fault protection control circuit 9 can be used to protect the output of the amplifier 4 from high levels of current during an undervoltage condition on the signal pin 6.

Figure 7:
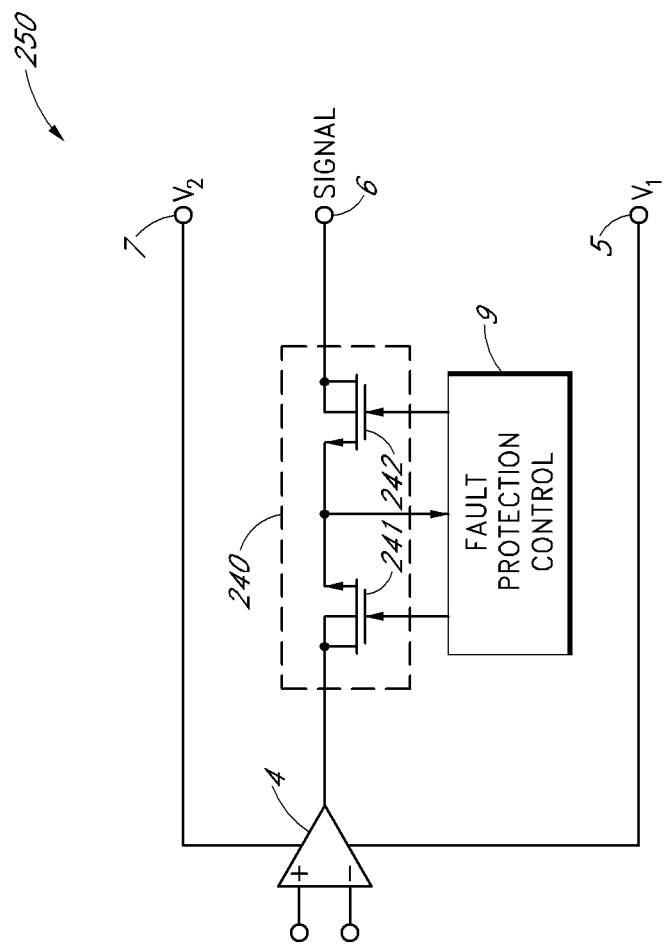
FIG. 7 is a circuit diagram of another embodiment of an IC.

FIG. 7 is a circuit diagram of another embodiment of an IC 250. The IC 250 includes the amplifier 4, the power low supply voltage pin 5, the signal pin 6, the power high supply voltage pin 7, the fault protection control circuit 9, and a fault protection circuit 240.

The IC 250 of FIG. 7 is similar to the IC 1 of FIG. 1, except that the IC 250 includes a different arrangement of the fault protection circuit. For example, the fault protection circuit 240 includes a first fault protection NMOS transistor 241 and a second fault protection NMOS transistor 242. The first fault protection NMOS transistor 241 includes a drain and body electrically connected to the output of the amplifier 4. The first fault protection NMOS transistor 241 further includes a gate electrically connected to a first output of the fault protection control circuit 9 and a source electrically connected to a source of the second fault protection NMOS transistor 242. The second fault protection NMOS transistor 242 further includes a gate electrically connected to a second output of the fault protection control circuit 9 and a source and body electrically connected to the signal pin 6.

In certain implementations, a fault protection circuit can use NMOS transistors to protect the output of an amplifier from overvoltage and undervoltage conditions on a signal pin. For example, NMOS transistors can be used in configurations using an n-type substrate and/or in configurations in which the bodies of the NMOS transistors can be electrically isolated from the substrate.

In one embodiment, the first and second NMOS transistors 241, 242 are n-type LDMOS (NLDMOS) transistors, such as NLDMOS transistors disposed on an n-type substrate. During normal operation of the amplifier 4, the fault protection control circuit 9 can be configured to turn on the first and second fault protection NMOS transistors 241, 242 so that the amplifier 4 can control a voltage level of the signal pin 6. Additionally, during an overvoltage condition on the signal pin 6, the fault protection control circuit 9 can be configured to turn on the first fault protection NMOS transistor 241 and to turn off the second fault protection NMOS transistor 242. Controlling the first and second fault protection NMOS transistors 241, 242 during an overvoltage condition in this manner can help prevent source-to-body parasitic diodes of the first and second fault protection NMOS transistors 241, 242 from becoming forward-biased during the overvoltage condition. For example, configuring the fault protection circuit 240 in this manner can provide enhanced performance relative to a scheme in which the second fault protection NMOS transistor 242 is turned off during an overvoltage condition on the signal pin 6, which can result in the source-to-body parasitic diode of the second fault protection NMOS transistor 242 activating during the overvoltage condition. During an undervoltage condition on the signal pin 6, the fault protection control circuit 9 can turn off the first fault protection NMOS transistor 241 and turn on the second fault protection NMOS transistor 242, which can help protect the amplifier 4 from excessive voltage conditions as well as to help prevent source-to-body parasitic diodes of the first and second fault protection NMOS transistors 241, 242 from conducting. The NMOS transistors 241, 242 can be enhancement-mode or depletion-mode MOS transistors or other FETs.

Applications

Devices employing the above described schemes can be implemented into various high performance electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   an amplifier including an output configured to generate an output signal;
   a signal pin configured to receive the output signal from the output of the amplifier;
   a fault protection circuit electrically connected between the output of the amplifier and the signal pin, wherein the fault protection circuit comprises a first transistor and a second transistor, wherein the first transistor includes a drain electrically connected to the output of the amplifier, a source, and a gate, and wherein the second transistor includes a drain electrically connected to the signal pin, a source electrically connected to the source of the first transistor, and a gate; and
   a fault protection control circuit configured to control the fault protection circuit at least in part by controlling voltage levels of the gates of the first and second transistors, wherein the fault protection control circuit includes an overvoltage detection and control circuit configured to detect an overvoltage condition of the signal pin and to turn off the first transistor when the overvoltage condition is detected and otherwise turn on the first transistor, and wherein the fault protection circuit further includes an undervoltage detection and control circuit configured to detect an undervoltage condition of the signal pin and to turn off the second transistor when the undervoltage condition is detected and otherwise turn on the second transistor,
   wherein the overvoltage detection and control circuit is powered at least in part by the signal pin, wherein the undervoltage detection and control circuit is configured to turn on the second transistor during the overvoltage condition.

2. The apparatus of claim 1, wherein the first and second transistors comprise p-type metal oxide semiconductor (PMOS) transistors.

3. The apparatus of claim 2, wherein the first transistor further comprises a body and the second transistor comprises a body, wherein the source and the body of the first transistor are electrically connected to the source and the body of the second transistor.

4. The apparatus of claim 3, wherein the first transistor further comprises a first parasitic diode between the drain and the body of the first transistor, and wherein the second transistor further comprises a second parasitic diode between the drain and the body of the second transistor, and wherein the fault protection control circuit is configured to turn off the first transistor and to turn on the second transistor when the overvoltage condition is detected, and wherein the fault protection control circuit is configured to turn on the first transistor and to turn off the second transistor when the undervoltage condition is detected.

5. The apparatus of claim 2, wherein the first and second transistors comprise high voltage p-type laterally diffused metal oxide semiconductor (PLDMOS) transistors.

6. An apparatus comprising:
   an amplifier including an output configured to generate an output signal;
   a signal pin configured to receive the output signal from the output of the amplifier;
   a fault protection circuit electrically connected between the output of the amplifier and the signal pin, wherein the fault protection circuit comprises a first transistor and a second transistor, wherein the first transistor includes a drain electrically connected to the output of the amplifier, a source, and a gate, and wherein the second transistor includes a drain electrically connected to the signal pin, a source electrically connected to the source of the first transistor, and a gate; and
   a fault protection control circuit configured to control the fault protection circuit at least in part by controlling voltage levels of the gates of the first and second transistors, wherein the fault protection control circuit includes an overvoltage detection and control circuit configured to detect an overvoltage condition of the signal pin and to turn off the first transistor when the overvoltage condition is detected and otherwise turn on the first transistor, and wherein the fault protection circuit further includes an undervoltage detection and control circuit configured to detect an undervoltage condition of the signal pin and to turn off the second transistor when the undervoltage condition is detected and otherwise turn on the second transistor,
   wherein, the fault protection control circuit is powered at least in part by the signal pin, and wherein a bias of the fault protection control circuit is provided by the signal pin by current at a node of the sources of the first and second transistors,
   wherein the overvoltage detection and control circuit comprises a first high voltage current source and a first resistor, wherein the first resistor is electrically connected between the gate and the source of the first transistor, and wherein the first high voltage current source is configured to provide a first current through the first resistor when no overvoltage condition is detected so as to keep on the first transistor.

7. The apparatus of claim 6, wherein the high voltage current source comprises an n-type laterally diffused metal oxide semiconductor (NLDMOS) transistor, wherein the NLDMOS transistor includes an n-type tub and a drain, wherein the n-type tub and the drain are configured to operate at different electrical potentials.

8. The apparatus of claim 7, wherein the high voltage current source further comprises a Zener diode including an anode electrically connected to the drain of the NLDMOS transistor and a cathode electrically connected to the n-type tub of the NLDMOS transistor.

9. The apparatus of claim 6, wherein the undervoltage detection and control circuit comprises a second high voltage current source and a second resistor, wherein the second resistor is electrically connected between the gate and the source of the second transistor, and wherein the second high voltage current source is configured to provide a second current through the second resistor when no overvoltage condition is detected so as to keep on the second transistor.

10. The apparatus of claim 9, further comprising a power low supply voltage pin and a power high supply voltage pin.

11. The apparatus of claim 10, further comprising a charge pump configured to electrically power at least a portion of the fault protection control circuit.

12. The apparatus of claim 11, wherein the overvoltage detection and control circuit comprises a first transistor differential pair configured to compare a reference voltage derived from the power high supply to a voltage of the signal pin.

13. The apparatus of claim 12, further comprising a transient response boost circuit configured to expedite the turn-off of the fault protection transistors by supplying extra bias current during the overvoltage condition.

14. The apparatus of claim 12, wherein the undervoltage detection and control circuit comprises a second transistor differential pair configured to compare a voltage of the power low supply voltage pin to the voltage of the signal pin.

15. The apparatus of claim 10, wherein the fault protection control circuit is powered from the signal pin such that the fault protection control circuit operates when the power high supply voltage pin is floating.

16. The apparatus of claim 1, wherein the first and second transistors comprise n-type metal oxide semiconductor (NMOS) transistors.

17. An apparatus comprising:
an amplifier including an output configured to generate an output signal;
a signal pin configured to receive the output signal from the output of the amplifier;
a fault protection circuit electrically connected between the output of the amplifier and the signal pin, wherein the fault protection circuit comprises a first transistor and a second transistor, wherein the first transistor includes a drain electrically connected to the output of the amplifier, a source, and a gate, and wherein the second transistor includes a drain electrically connected to the signal pin, a source electrically connected to the source of the first transistor, and a gate; and
a fault protection control circuit configured to control the fault protection circuit at least in part by controlling voltage levels of the gates of the first and second transistors, wherein the fault protection control circuit is further configured to detect an overvoltage condition of the signal pin and to turn off one of the first transistor or the second transistor when the overvoltage condition is detected, and wherein the fault protection control circuit is further configured to detect an undervoltage condition of the signal pin and to turn off the other of the first transistor or the second transistor when the undervoltage condition is detected,
wherein the fault protection control circuit is powered at least in part by the signal pin, wherein the fault protection control circuit is configured to turn on the other of the first transistor or the second transistor when the overvoltage condition is detected, and wherein the fault protection control circuit is configured to turn on the one of the first transistor or the second transistor when the undervoltage condition is detected.

18. The apparatus of claim 17, wherein a bias of the fault protection control circuit is provided by current at a node of the sources of the first and second transistors.

19. The apparatus of claim 17, wherein the first and second transistors comprise p-channel field effect transistors or n-channel field effect transistors.

20. The apparatus of claim 17, wherein the fault protection control circuit is further configured to turn on the first and second transistors when no overvoltage and undervoltage conditions are detected.

21. The apparatus of claim 1, further comprising a charge pump configured to electrically power at least a portion of the fault protection control circuit.

22. The apparatus of claim 1, wherein a bias current of the overvoltage detection and control circuit flows from a node of the sources of the first and second transistors.

23. The apparatus of claim 22, wherein a magnitude of the bias current changes in relation to a voltage of the signal pin.

24. The apparatus of claim 1, wherein a bias current of the undervoltage detection and control circuit flows from a node of the sources of the first and second transistors.

25. The apparatus of claim 1, wherein the overvoltage detection and control circuit is configured to turn on the first transistor during the undervoltage condition.

* * * * *